United States Patent
Menut et al.

(10) Patent No.: US 7,060,596 B2
(45) Date of Patent: *Jun. 13, 2006

(54) PROCESS FOR FABRICATING A SINGLE-CRYSTAL SUBSTRATE AND INTEGRATED CIRCUIT COMPRISING SUCH A SUBSTRATE

(75) Inventors: Olivier Menut, Grenoble (FR); Yvon Gris, Tullins (FR)

(73) Assignee: STMicroelectronics, S.A., Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/044,402

(22) Filed: Jan. 11, 2002

(65) Prior Publication Data

US 2002/0094678 A1 Jul. 18, 2002

(30) Foreign Application Priority Data

Jan. 12, 2001 (FR) ................................. 01 00414

(51) Int. Cl.
*H01L 21/20* (2006.01)

(52) U.S. Cl. ...................... 438/486; 438/429; 438/442; 438/481

(58) Field of Classification Search ................ 438/222, 438/226, 357, 360, 363, 429, 442, FOR. 167, 438/FOR. 221, 481, 486
See application file for complete search history.

(56) References Cited

U.S. PATENT DOCUMENTS

| | | | |
|---|---|---|---|
| 4,649,625 A | 3/1987 | Lu | |
| 4,942,554 A | 7/1990 | Kircher et al. | |
| 5,637,529 A * | 6/1997 | Jang et al. | 438/442 |
| 5,891,763 A * | 4/1999 | Wanlass | 438/149 |
| 5,953,600 A | 9/1999 | Gris | |
| 6,001,706 A * | 12/1999 | Tan et al. | 438/424 |
| 6,074,954 A * | 6/2000 | Lill et al. | 438/710 |
| 6,168,996 B1 * | 1/2001 | Numazawa et al. | 438/270 |
| 6,214,653 B1 * | 4/2001 | Chen et al. | 438/153 |
| 6,537,873 B1 * | 3/2003 | Menut et al. | 438/245 |

FOREIGN PATENT DOCUMENTS

| | | | |
|---|---|---|---|
| JP | 62092365 A * | 4/1987 | |
| JP | 62293759 | 12/1987 | |

OTHER PUBLICATIONS

Wolf et al., Silicon Processing for the VLSI ERA; Lattice Press, Sunset Beach, CA; 2000, chapter 1, p. 1-34.*
Preliminary Search Report dated Sep. 11, 2001 for French Application No. 0100414.

* cited by examiner

*Primary Examiner*—N. Drew Richards
(74) *Attorney, Agent, or Firm*—Lisa K. Jorgenson; Jon A. Gibbons; Fleit, Kain, Gibbons, Gutman, Bongini & Bianco P.L.

(57) ABSTRACT

An initial single-crystal substrate 1 having, locally and on the surface, at least one discontinuity in the single-crystal lattice is formed. The initial substrate is recessed at the discontinuity. The single-crystal lattice is amorphized around the periphery of the recess. A layer of amorphous material having the same chemical composition as that of the initial substrate is deposited on the structure obtained. The structure obtained is thermally annealed in order to recrystallize the amorphous material so as to be continuous with the single-crystal lattice of the initial substrate.

12 Claims, 4 Drawing Sheets

PROCESS FOR FABRICATING A SINGLE-CRYSTAL SUBSTRATE AND INTEGRATED CIRCUIT COMPRISING SUCH A SUBSTRATE

CROSS REFERENCE TO RELATED APPLICATIONS

This application is based upon and claims priority from prior French Patent Application No. 0100414, filed Jan. 12, 2001, the disclosure of which is hereby incorporated by reference in its entirety.

BACKGROUND OF THE INVENTION

1. Field of the Invention

The present invention generally relates to the field of integrated circuits, and more particularly to the production of an initial single-crystal substrate, for example made of silicon, having a discontinuity in the single-crystal lattice, such as a buried trench, for the epitaxial growth of a homogeneous single-crystal silicon layer.

2. Description of Related Art

The processes for fabricating semiconductor components may destroy the crystal continuity of the surface oaf portion of the initial single-crystal semiconductor substrate. This is especially the case during the formation of trenches. The trenches are subsequently filled so as to produce a dielectric insulation, a capacitor or a junction. The semiconductor substrate has, at the position of the trench, a different material without any crystal structure. Consequently, the surface of that portion of the substrate which is occupied by the trench, or more generally by any other local crystal defect, cannot be used to form semiconductor devices, particularly junctions or thin thermal oxides.

This is because the junctions through which a crystal defect passes have leakage currents. The oxides that have grown from a crystal defect exhibit low breakdown voltages or short circuits.

Accordingly, a need exists to overcome these problems and to produce a substrate with a single crystal lattice allowing the subsequent formation of an epitaxial layer of silicon free of crystal defects.

SUMMARY OF THE INVENTION

The present invention provides a substrate with a single-crystal lattice which makes it possible to repair the local surface defects, to ensure planarity and surface homogeneity, and to ensure continuity of the single-crystal lattice of this surface.

The invention provides a process for fabricating a semiconductor substrate with a single-crystal lattice, in which:

a) an initial single-crystal substrate having, locally and on the surface, at least one discontinuity in the crystal lattice is formed;

b) the initial substrate is recessed at the discontinuity;

c) the single-crystal lattice is amorphized around the periphery of the recess; and d) a layer of amorphous material having the same chemical composition as that of the initial substrate is deposited on the structure obtained in step c);

e) the structure obtained in step d) is thermally annealed in order to recrystallize the amorphous material so as to be continuous with the single-crystal lattice of the initial substrate.

The invention therefore makes it possible, for example, to form, on the surface, a single-crystal silicon layer which, being continuous with the rest of the initial silicon substrate offers a perfectly plane and uniform surface on which a single-crystal silicon layer free of crystal defects may be grown by epitaxy.

The process may comprise, prior or subsequent to step e), a surface planarization step, for example a chemical-mechanical polishing step.

In step c), the amorphization is localized and advantageously self-aligned with the discontinuity.

The initial substrate comprises, for example, at least one material from the group formed by silicon, germanium, silicon carbide, gallium arsenide and an alloy of at least some of the above elements.

The amorphizing step comprises a localized ion implantation around the recess by a masking operation. The implantation may use heavy particles, for example fluoride ions.

The invention applies advantageously when the discontinuity in the crystal lattice is formed by a trench.

Thus, according to one method of implementation, in step a), a first layer of a first material, for example silicon dioxide, and a second layer of a second material, for example silicon nitride, are deposited in succession on the initial substrate and then a trench is etched and filled with a fill material, the filled trench forming the crystal lattice discontinuity.

In step b), the first layer and an upper portion of the trench fill material are selectively etched with respect to the second layer so as to form lateral cavities and the recess at the crystal discontinuity, and the second layer is removed.

The fill material may comprise at least one element from the group formed by silicon, a silicon oxide and a silicon nitride. The filling maybe heterogeneous and use several types of insulations. It may also comprise, at its center, a conducting material, for example doped or undoped polysilicon, or air, or be partly filled with an insulating fill material together with the ambient air.

The filling maybe carried out by depositing silicon oxide as a conformal coating or else by thermal oxidation of the silicon.

In step a), a buried capacitor may be formed in the trench.

In this case, the trench filling operation may comprise the following steps:

the walls of the trench are lined with oxide by thermal oxidation;

highly doped polycrystalline silicon is deposited in the trench so as to fill it; and the previously deposited polycrystalline silicon is etched so that the fill level of the trench is below the surface of the initial substrate.

In step a), a buried diode may be formed in the trench.

In this case, the trench filling operation may comprise the following steps:

highly doped polycrystalline silicon is deposited in the trench so as to fill it;

the previously deposited polycrystalline silicon is etched so that the fill level of the trench is below the surface of the initial substrate.

In general, according to the invention, the closing-off of the trenches with a "plug" of single-crystal material (for example silicon) allows, moreover, greater freedom with regard to the width and the nature of the trenches formed.

Furthermore this additional degree of freedom makes it possible, advantageously, to form electronic components buried in a substrate. Forming buried electronic components, such as capacitors or diodes, means that semiconductor devices formed subsequently on substrates with a uniform surface have a smaller footprint and exhibit greater performance and functionality.

In another embodiment, the invention to provide an integrated circuit comprising a single-crystal silicon substrate formed in accordance with the process defined above.

This circuit may comprise at least two adjacent transistors, for example based on CMOS or BiCMOS technology, formed within the substrate comprising at least one buried trench and the surface of which is made uniform in accordance with the above process. The trench forms an isolating trench separating the contiguous buried layers of the transistors.

BRIEF DESCRIPTION OF THE DRAWINGS

The subject matter which is regarded as the invention is particularly pointed out and distinctly claimed in the claims at the conclusion of the specification. Further advantages and features of the invention will become apparent on examining the detailed description of entirely nonlimiting embodiment embodiments.

These embodiments are now described with reference to the appended figures which show schematically the main steps of embodiments of the process for fabricating a substrate according to the invention.

DETAILED DESCRIPTION OF AN EMBODIMENT

Figure 1A:
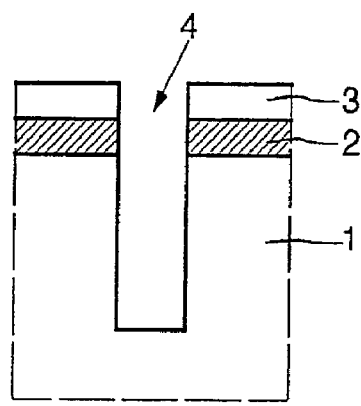
FIGS. 1a to 1h show schematically the main steps of the process for fabricating a substrate from a semiconductor having at least one isolating trench.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

In general, unless otherwise indicated, singular elements maybe in the plural and vice versa with no loss of generality.

In the drawing like numerals refer to like parts through several views.

The starting substrate for the process of the invention, or initial substrate 1, is illustrated in FIG. 1a and comprises here at least one narrow trench. This trench maybe deep or shallow. It may be formed, according to one method of implementing the process of the invention, by firstly depositing a silicon oxide layer 2 on the initial single-crystal silicon substrate 1. The thickness of this layer 2 may vary between 0.01 microns and 1 micron, and is preferably about 2000 Å.

Next, a silicon nitride layer 3 is deposited on the oxide 2. The thickness of this layer 3 may also vary between 0.01 microns and 1 micron, and is also preferably about 2000 Å.

Next, the nitride 3, followed by the oxide 2 and finally the single-crystal silicon of the substrate 1 are anisotropically etched in a conventional manner with the aid of a photolithography operation in order to form the trench 4.

The trench 4 has a depth of between 1 and 15 mm and has a variable width, preferably less than 1 mm.

According to the process of the invention, the trench 4 thus etched is then filled with the appropriate fill material for the use to which it is desired to put this trench.

According to a first embodiment, an isolating trench is formed for the purpose, for example, of separating contiguous buried layers of opposite conductivity.

Thus, according to this embodiment of the process of the invention, the trench 4 is filled with a dielectric material. As dielectric material, it is preferred to choose silicon oxide.

The filling of the trench with silicon oxide 5 maybe carried out in various conventional ways.

Figure 1B:
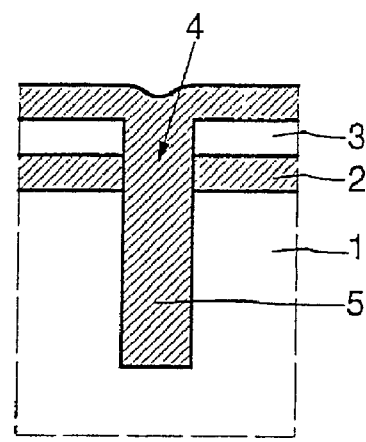

It is conceivable to deposit silicon oxide as a conformal coating, as illustrated in FIG. 1b. The oxide is therefore also deposited over the entire surface of the wafer.

Figure 1C:
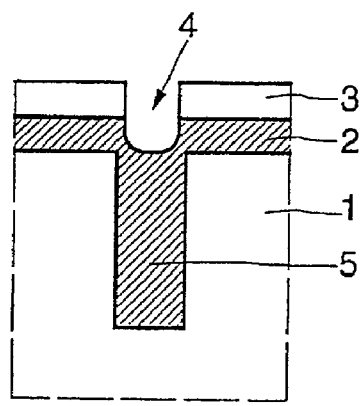

It is preferable, however, to use the deposition of silicon oxide by thermal oxidation, as illustrated in FIG. 1c. Firstly, this involves a method more suited to the presence of possibly narrow trenches. Secondly, a denser oxide is obtained than with the conformal coating.

Moreover, if the silicon oxide grows only on the silicon, only the trench 4, slightly widened by oxidation of the silicon of the walls, is filled with oxide.

Figure 1D:
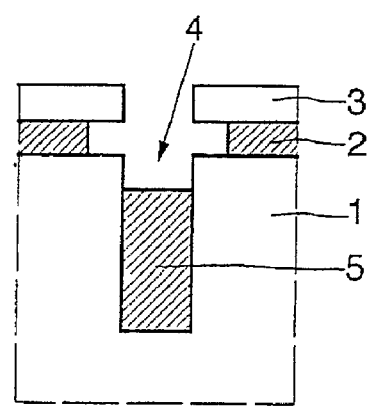

In accordance with the process of the invention, a controlled deoxidation is then carried out, essentially so as to form, under the silicon nitride layer 3, two lateral cavities of given width in the oxide layer 2 as illustrated in FIG. 1d. Within the context of the first embodiment of the process of the invention, some of the silicon oxide 5 in the trench 4 and, where appropriate, the silicon oxide layer on the surface of the wafer are removed.

This deoxidation is carried out by isotropic etching with hydrofluoric acid or else by isotropic plasma etching with fluorine.

Next, the silicon nitride layer is conventionally removed.

Figure 1E:
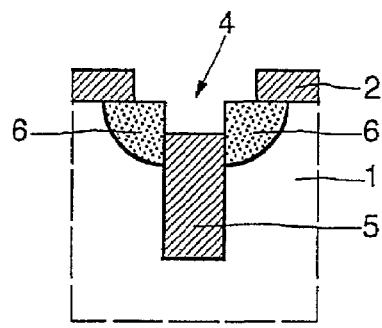

The next step of the process of the invention is illustrated in FIG. 1e and consists in amorphizing the exposed silicon. This involves the single-crystal silicon of the initial substrate 1 exposed by the deoxidation step. These regions are labeled 6. The amorphizing is localized and self-aligned with respect to the trench and is conventionally carried out by destroying the single-crystal lattice of the silicon, for example by the implantation of heavy particles such as ions. Within the context of the invention, it will be especially preferred to implant fluoride ions.

Figure 1F:
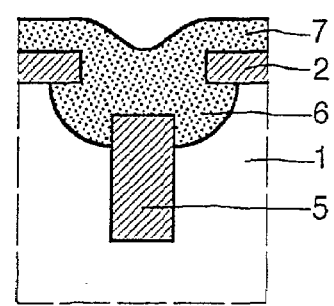

According to the process of the invention, and as illustrated in FIG. 1f, an amorphous silicon layer 7 is then deposited so as to at least fill the lateral cavities and the recess above the trench 4. The amorphous silicon is conventionally deposited at low temperature. For example, it is possible to use an LPCVD (low-pressure chemical vapor deposition) furnace, injecting silane at a sufficiently low temperature, for example less than 600° C., typically less than 400° C.

Figure 1G:
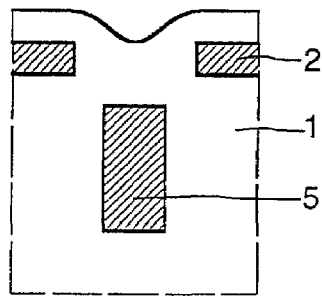

FIG. 1g illustrates one particular method of implementing the invention, in which an annealing operation is carried out prior to the steps of making the surface of the substrate uniform. The thermal annealing allows the amorphous silicon to recrystallize, by epitaxial regrowth of the amorphous silicon 6, 7 starting from the single-crystal silicon of the initial substrate 1. The restructuring of the single-crystal silicon lattice results in FIG. 1g in which the previous amorphous silicon layer now merges with the single-crystal silicon of the substrate 1.

It should be noted here that, according to the invention, the region 6 is spatially limited and the boundary between this region 6 and the substrate 1 is easily localized by the ion implantation. This boundary is moreover a "soft" boundary, that is to say the transition from the single-crystal Si state to the amorphous Si state is very gradual. These characteristics result in the region 6 being recrystallized very efficiently, and without any defects, something which cannot easily be obtained with a large area to be recrystallized.

Next, a chemical-mechanical polishing operation is carried out, stopping on the silicon oxide layer 2 in order to remove the recrystallized silicon layer on the surface of the wafer. Next, the silicon oxide layer 2 is conventionally removed. In order to planarize the surface, the wafer is then subjected to a final chemical-mechanical polishing operation.

Figure 1H:
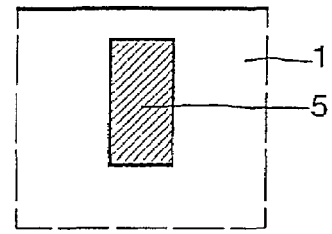

After this succession of steps, a final single-crystal silicon substrate 1 is obtained, according to the first embodiment of the process of the invention, which has a perfectly planar and uniform single-crystal surface on which it will be possible to carry out defect-free epitaxy. This semiconductor substrate includes a buried isolating trench labeled 5 in FIG. 1h.

According to a second embodiment, it is possible to produce a silicon substrate which has its surface made uniform according to the process of the invention and which includes a buried capacitor formed in a trench.

Figure 2A:
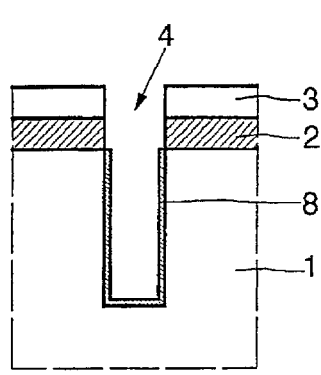
FIGS. 2a to 2f show schematically the main steps of the process for fabricating a semiconductor substrate having at least one buried capacitor.

To produce such a substrate, a trench 4 is firstly formed as previously in the substrate 1, as illustrated in FIG. 1a. Next, a controlled thermal oxidation is carried out so as to form a silicon oxide layer 8 having a thickness of between 40 and 1000 Å, preferably between 50 and 300 Å, on the walls of the trench 4, obtaining the device illustrated in FIG. 2a.

Next, highly doped polycrystalline silicon 9 is deposited on the wafer so as to fill the trench 4. The doping of the silicon is carried out in situ.

Figure 2B:
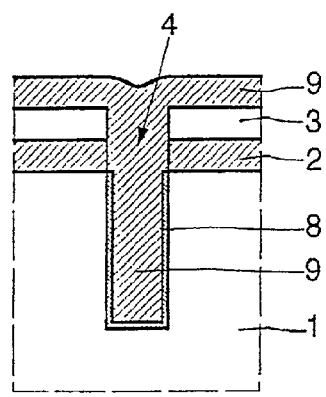

A device like that illustrated in FIG. 2b is obtained.

Next, according to the process of the invention, the previously deposited polycrystalline silicon 9 is etched, so as at least to remove it from the surface of the wafer. Moreover, this etching is carried out until the polycrystalline silicon level in the trench 4 is below the surface of the initial substrate 1.

Figure 2C:
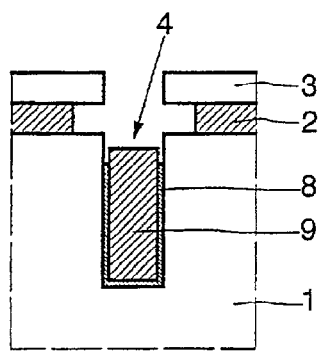

The next step consists of a controlled deoxidation as described above in the case of the first embodiment. The device illustrated in FIG. 2c is then obtained, in which the trench is lined with a silicon oxide layer 8, the height of which is less than the height of the doped polycrystalline silicon layer 9 in the trench 4. Two lateral cavities of a given width appear, below the silicon nitride layer 3, in the silicon oxide layer 2.

The silicon nitride mask 3 is then conventionally removed.

According to the process of the invention, the exposed silicon is then amorphized.

Within the context of this second embodiment of the process of the invention, the silicon exposed at this stage of the process is the single-crystal silicon of the substrate 1, together with the emergent portion of doped polycrystalline silicon 9 in the trench 4. Thus, amorphous silicon regions labeled 6 and 6a are created.

The amorphization is localized and self-aligned with respect to the trench.

Figure 2D:
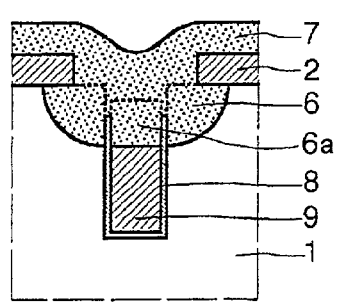

Next, an amorphous silicon layer 7 is deposited over the entire surface of the wafer in the same way as described above within the context of the first embodiment. This then results in the device illustrated in FIG. 2d, in which, in a trench 4 etched in a substrate 1, a polycrystalline silicon block 9 is partially enveloped in a silicon oxide layer 8. The height of this block, less than that of the trench 4, is also less than the height of the silicon oxide envelope 8. This element is surmounted by an amorphous silicon region comprising the amorphized silicon regions 6 and 6a and the amorphous silicon 7 deposited. The amorphous layer 7 deposited therefore acts here as a link between the regions 6 and 6a and as a means of filling in the surface.

Figure 2E:
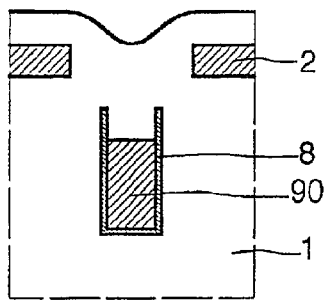

According to one particular method of implementing the process of the invention, and as described above within the context of the first embodiment, a thermal annealing operation is carried out so as to restore the crystal structure of the amorphous silicon. As illustrated in FIG. 2e, the recrystallized silicon merges with the single-crystal silicon of the substrate 1. The amorphization of the region 6a prevents crystal defects from "rising" into the single-crystal layer from the polycrystalline silicon.

Figure 2F:
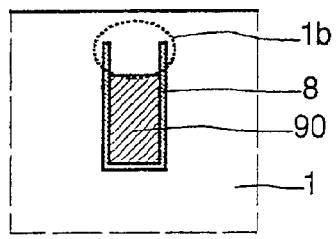

After the steps of making the surface of the substrate uniform, which are the same as in the first embodiment, a single-crystal silicon substrate illustrated in FIG. 2f is obtained, the perfectly planar and uniform single-crystal surface of which allows defect-free epitaxial growth of single-crystal silicon. Moreover, the substrate includes a buried capacitor consisting of highly doped polycrystalline silicon 90 partially enveloped with a silicon oxide wall 8 separating it laterally from the substrate 1. Above this buried capacitor and in the substrate 1, there remains a highly doped region 1b, of the same conductivity as the polycrystalline silicon 90. This region corresponds to the amorphized polycrystalline silicon region 6a and to the silicon portion 7 doped by the diffusion of dopants during the annealing.

The localized destruction according to the invention of the crystalline lattice, before its reconstruction, is particularly advantageous in the case of capacitive trenches since it makes it possible to bury the polycrystalline silicon 90 (the entire capacitor) by controlled etching of the oxide of the sidewall 8, without it being necessary to provide an additional oxide.

According to a third embodiment, it is also possible to form a buried diode in a silicon substrate, the surface of which is planarized as in the process of the invention, for the purpose of homogeneous epitaxy allowing electronic components to be produced.

According to this embodinent, highly doped polycrystalline silicon 10 is deposited in a trench formed as previously.

Figure 3A:
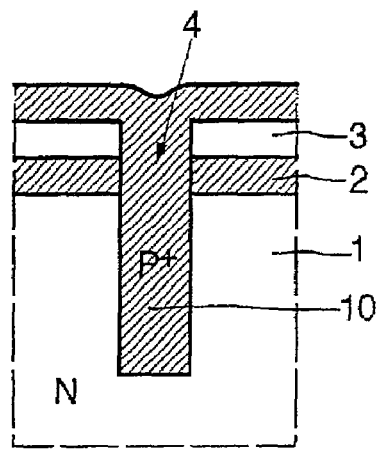
FIGS. 3a to 3d show schematically the main steps of the process for fabricating a semiconductor substrate having at least one buried diode.

According to the embodiment illustrated in FIG. 3a, an n-doped substrate 1 and p$^+$-doped polycrystalline silicon 10 have been envisioned. It is important to note however, that opposite conductivities also fall within the true scope and spirit of the invention.

Next, the polycrystalline silicon layer 10 formed on the surface is removed using standard methods. The removal of the polycrystalline silicon 10 is continued until a fill level below the surface of the substrate 1 is obtained.

Figure 3B:
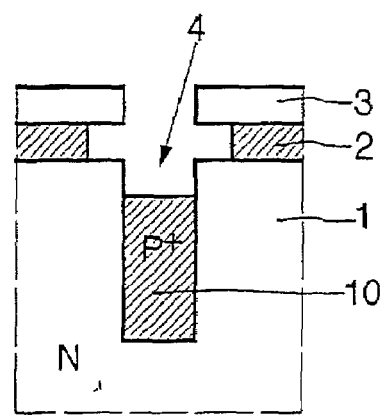

This step is followed, according to the process of the invention, by a controlled deoxidation. This deoxidation is more fully described above within the context of the first embodiment. The device illustrated in FIG. 3b is then obtained.

According to the process of the invention, the silicon nitride layer 3 is then removed using conventional methods.

Next, the exposed silicon is amorphized. In the case of this third embodiment, the exposed silicon is composed of the single-crystal silicon regions 6 of the substrate 1 visible owing to the deoxidation and to the etching of the polycrystalline silicon filling the trench, and of the upper part 6b of this material in the trench. Here again, the amorphization is localized and self-aligned with respect to the trench.

Figure 3C:
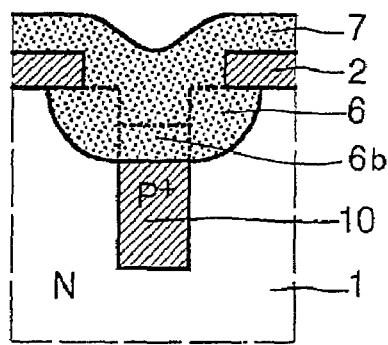

Next, an amorphous silicon layer 7, having the opposite conductivity to that of the polycrystalline silicon 10 in the trench 4, is deposited using the conventional methods. This layer merges with the amorphized silicon regions 6 and 6b. The substrate illustrated in FIG. 3c is then obtained.

According to the process of the invention, a thermal annealing operation is then carried out, which allows the amorphous silicon to be recrystallized. Here again, as indicated above in the case of the previous variants, crystal defects are prevented from forming. Within the context of this third embodiment, the annealing also allows the $p^+$ dopants to diffuse into the n-type substrate forming a p-doped single-crystal silicon envelope 11 around the highly $p^+$-doped polycrystalline silicon 10.

Next, according to one particular method of implementing the process of the invention, the surface of the substrate 1 is planarized by the removal of the silicon oxide layer 2 and the chemical-mechanical polishing of the wafer.

Figure 3D:
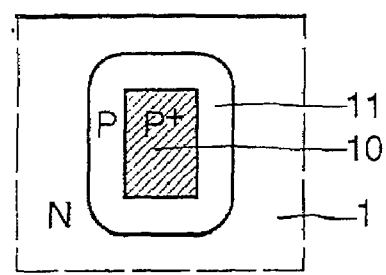

The substrate illustrated in FIG. 3d (seen in section), which has a perfectly planar and uniform single-crystal surface allowing homogeneous single-crystal silicon epitaxy is then obtained. The substrate furthermore includes a buried diode consisting of a highly $p^+$-doped region entirely surrounded by a p-doped envelope of given thickness.

The possibility of producing a silicon substrate which includes buried isolating trenches or buried components, and the surface of which is perfectly planar and uniform, opens up new horizons for the production of semiconductor devices.

As already mentioned above, substrates which include isolating trenches may advantageously be used to produce semiconductor devices comprising several adjacent transistors. In these devices, not only is there no or very little risk of a reduction in the breakdown voltage or of punch-through of the buried layers, but also the epitaxial single-crystal silicon layer in which the transistors, free of crystal defects, are formed is suitable for producing any type of architectural module.

According to the invention, the uniformization of the surface of a substrate including buried elements formed in trenches has the advantage of being able to produce, on such substrates, devices which are extremely reliable and of high performance and which have a smaller footprint. This second aspect is particularly beneficial when considering the constant size reduction of integrated circuits, together with their high level of integration.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A process for fabricating a semiconductor substrate with a single-crystal lattice, the process comprising the successive steps of:
   a) forming a substrate with a single-crystal lattice, the substrate having a top surface with at least one discontinuity in the single-crystal lattice therein, whereby the top surface of the substrate has a recess at the discontinuity on the top surface;
   b) amorphizing the single-crystal lattice around a periphery of the recess to produce a structure including an amorphized region around the periphery of the recess;
   c) prior to any thermal annealing, depositing a layer of amorphous material having the same chemical composition as that of the substrate directly on the structure produced in step b; and
   d) thermally annealing the amorphous material and the amorphized region around the periphery of the recess, so as to be continuous with each other and with the single-crystal lattice of the substrate.

2. The process according to claim 1, further comprising the step of:
   planarizing the top surface of the substrate.

3. The process according to claim 2, wherein the step of planarizing the top surface includes planarizing the top surface by a chemical-mechanical polishing.

4. The process according to claim 1, wherein the step of forming the substrate includes forming the substrate with at least part of the material selected from the group of material consisting of silicon, germanium, silicon carbide, and gallium arsenide.

5. The process according to claim 3, wherein the step of amorphizing includes amorphizing with a localized ion implantation around the recess by a masking operation.

6. The process according to claim 2, wherein the step of forming a substrate includes the sub-steps of:
   depositing a first layer of a first material and a second layer of a second material in succession on the substrate;
   etching a trench;
   filling the trench with a fill material so as to form the single-crystal lattice discontinuity;
   etching the first layer and an upper portion of the trench fill material so as to form lateral cavities in the second layer in communication with the trench and so as to form the recess at the discontinuity; and
   removing the second layer.

7. The process according to claim 6, wherein the sub-step of filling of the trench with fill material includes filling the trench with at least part of the fill material selected from the group of fill material consisting of silicon, a silicon oxide and a silicon nitride.

8. The process according to claim 6, wherein the sub-step of filling of the trench with fill material includes filling at least part of the trench with an insulating fill material.

9. The process according to claim 6, wherein the sub-step of filling of the trench is carried out by depositing silicon oxide as a conformal coating.

10. The process according to claim 6, wherein the sub-step of filling of the trench is carried out by thermal oxidation.

11. The process according to claim 6, wherein the step of amorphizing includes amorphizing the single-crystal lattice around a periphery of the recess so as to be self-aligned with the trench.

12. The process according to claim 5, wherein the step of amorphizing includes the implantation of fluoride ions into the single-crystal lattice around the periphery of the recess.

* * * * *